United States Patent [19]

Friberg et al.

[11] 3,908,264

[45] Sept. 30, 1975

[54] METHOD FOR CALIBRATING A RESONANT FREQUENCY

[75] Inventors: Vincent P. Friberg, Longmeadow, Mass.; John Chesney, Roselle Park, N.J.

[73] Assignee: General Instrument Corporation, Clifton, N.J.

[22] Filed: Apr. 24, 1974

[21] Appl. No.: 463,579

[52] U.S. Cl. ........................ 29/593; 29/602; 336/90
[51] Int. Cl.[2] ........................ H01F 7/06
[58] Field of Search ............ 29/602, 593; 324/57 Q; 336/90, 98

[56] References Cited

UNITED STATES PATENTS

| | | | |
|---|---|---|---|
| 2,245,373 | 6/1941 | Weis et al. | 29/602 |
| 2,675,526 | 4/1954 | Friberg | 336/98 X |
| 3,090,907 | 5/1963 | Maeda | 336/90 |
| 3,548,492 | 12/1970 | Weber | 29/602 |

*Primary Examiner*—Carl E. Hall

[57] ABSTRACT

Method and apparatus for calibrating a resonant frequency circuit and in particular an L-C circuit module of a modular filter is disclosed. The windings of the inductor are located on the inductor core such that a portion of the core remains exposed. The capacitor and inductor are interconnected and mounted on a base provided with the appropriate input and output terminals. The base is mounted on the test fixture which has the appropriate corresponding terminal receptacles. A test fixture shielding enclosure is placed over the assembly. The test fixture shielding enclosure is identical to that which will be provided in the completed module except that it is provided with an opening aligned with the exposed portion of the inductor core. The circuit is energized, and the resonant frequency of the L-C circuit is monitored. A tool capable of removing a portion of the inductor core material is inserted through the opening in the test fixture shielding enclosure into contact with the exposed portion of the inductor core. The appropriate amount of core material is removed by the tool, thereby altering the resonant frequency to the desired level. In this manner, each of the L-C circuit modules which make up the filter is prealigned under simulated actual operating conditions prior to final assembly, thereby eliminating the necessity of testing and tuning the filter after the modules are assembled.

2 Claims, 3 Drawing Figures

METHOD FOR CALIBRATING A RESONANT FREQUENCY

The present invention relates to electrical filters comprised of one or more L-C circuit modules and in particular to a method and apparatus for aligning each individual module under simulated operating conditions in order to eliminate the testing and tuning of the filter after the filter has been assembled.

Electrical filters are well known in the art and are used in a vast number of different applications in electronics and other related industries. These filters take a variety of forms but basically are constructed of one or more circuits, preferably in modular form, each of which contains at least an inductor and a capacitor which are electrically connected such that the filter acts to permit certain frequencies to pass through it while attenuating other frequencies.

An example of one of such filters is described in detail in another patent application, Ser. No. 460,274, filed Apr. 12, 1974, and entitled "MODULAR L-C FILTER", assigned to the assignee of this application. The modular L-C filter described therein comprises one or more L-C circuit modules each of which includes an inductor formed of a core in the shape of a toroid around which a conductor is wound a given number of times to define a multi-turn winding. The module also includes a capacitor which is physically situated within the opening associated with the core and electrically connected to the conductor to a portion of a turn of the winding. The capacitor is electrically connected to the conductor and physically oriented relative to the core such that the current flowing through the turn partially formed by the capacitor induces a magnetic field in the core in the same sense as the current flowing through the conductor. The inductor-capacitor assembly is assembled and mounted on a base having terminals extending therefrom. The appropriate electrical connections are made between the terminals and the circuit and a shielding member is placed over the assembly. A printed circuit board having the appropriate number of terminal receptacles is provided for mounting the modules. Because of the modular nature of the filter a considerable degree of design flexibility is present in that as many modules as desired for a particular application may be included in the filter. The circuit board is normally provided with the appropriate interconnection components such as capacitors such that the modules may be appropriately interconnected to form the filter.

While different types of electronic circuits are successfully made from preassembled modular elements or modules, large scale mass production of filters such as those described above has proven difficult because of problems associated with the final adjustment or tuning of the filter. These problems result from the difficulties involved in tuning each module such that the entire filter operates effectively at the desired frequencies. In particular, since the modules, once mounted on the printed circuit board, must be tuned without their respective shielding covers, interaction between two modules occur which are not present under actual operating conditions when the shielding covers are in place. Thus, a filter tuned on the assembly line may act differently under actual operating conditions when the interaction between the modules is no longer present. As a result, while it is advantageous from a production standpoint to produce filters from modular elements, the final adjustments on modular filters have proven time consuming and the additional labor required has increased significantly the cost of producing such filters.

While throughout the instant application the present invention is described in conjunction with the calibration of the above-mentioned type of modular filters, it should be noted that the present invention may be used to calibrate a variety of different types of L-C circuit modules other than the one described. Hence, the present invention should not be construed as being limited to the calibration of this type of module, which is used herein for purposes of illustration only.

It is, therefore, a prime object of the present invention to provide method and apparatus for calibrating a resonant frequency circuit module such that the module is prealigned prior to assembly into a filter, thereby eliminating the necessity for final tuning and adjustment of the filter.

It is another object of the present invention to provide method and apparatus for calibrating a resonant frequency circuit module wherein the calibration of the module takes place under simulated actual operating conditions.

It is a further object of the present invention to provide method and apparatus of calibrating resonant frequency circuit modules wherein the inductor and capacitor assembly is placed within a test fixture shielding member substantially the same as the shielding member incorporated in the final filter assembly such that actual circuit operating conditions are simulated.

It is still another object of the present invention to provide method and apparatus for calibrating a resonant frequency circuit module wherein a test fixture shielding cover is provided with an access opening aligned with an exposed portion of the inductor core to permit the insertion of a tool to provide for the removal of the appropriate portion of core material.

It is a still further object of the present invention to provide method and apparatus for calibrating a resonant frequency circuit module wherein the effect on the resonant frequency of this circuit caused by the removal of core material may be continuously monitored during the removal operation.

In accordance with the present invention, method and apparatus for calibrating a resonant frequency circuit module is provided. The circuit to be calibrated includes at least an inductor and a capacitor. The inductor is wound such that a portion of the core thereof remains exposed. The inductor-capacitor subassembly is then mounted on a base having terminals extending therefrom.

A test fixture is provided including a surface having terminal receptacles thereon for demountably accepting the terminals of the subassembly in the conventional manner. The base is also provided with input means and output means each of which is connected to the appropriate terminal receptacles. A test fixture shielding enclosure, similar to the one to be used when the module is completed, is provided to enclose the subassembly. The circuit is energized, as by connecting a signal generator to the input means of the test fixture. The frequency response of the subassembly is monitored by connecting the output means of the test fixture to an oscilloscope or other appropriate monitoring device.

The test fixture shielding enclosure is provided with an opening aligned with an exposed portion of the inductor core. A tool is inserted through the opening and in contact with the surface of the core. The tool is utilized to remove a portion of the core material such that the frequency of the resonant circuit may be adjusted to the desired level. Since the process is continuously monitored by means of the oscilloscope, the circuit may be accurately tuned.

Each of the modules in the filter are aligned in this way. The filter is then assembled by mounting the modules on a printed circuit board provided for this purpose and having the appropriate interconnections and interconnecting components present thereon. The filter may again be tested but no further adjustments are normally required. In this manner economy is achieved through high yield resulting from electrical pretesting and the elimination of the final tuning of the filter.

To the accomplishment of the above, and to such other objects as may hereinafter appear, the present invention relates to method and apparatus for calibrating a resonant frequency circuit as defined in the appended claims and as described in the specification, taken together with the accompanying drawings wherein like numerals refer to like parts and in which:

Figure 1:
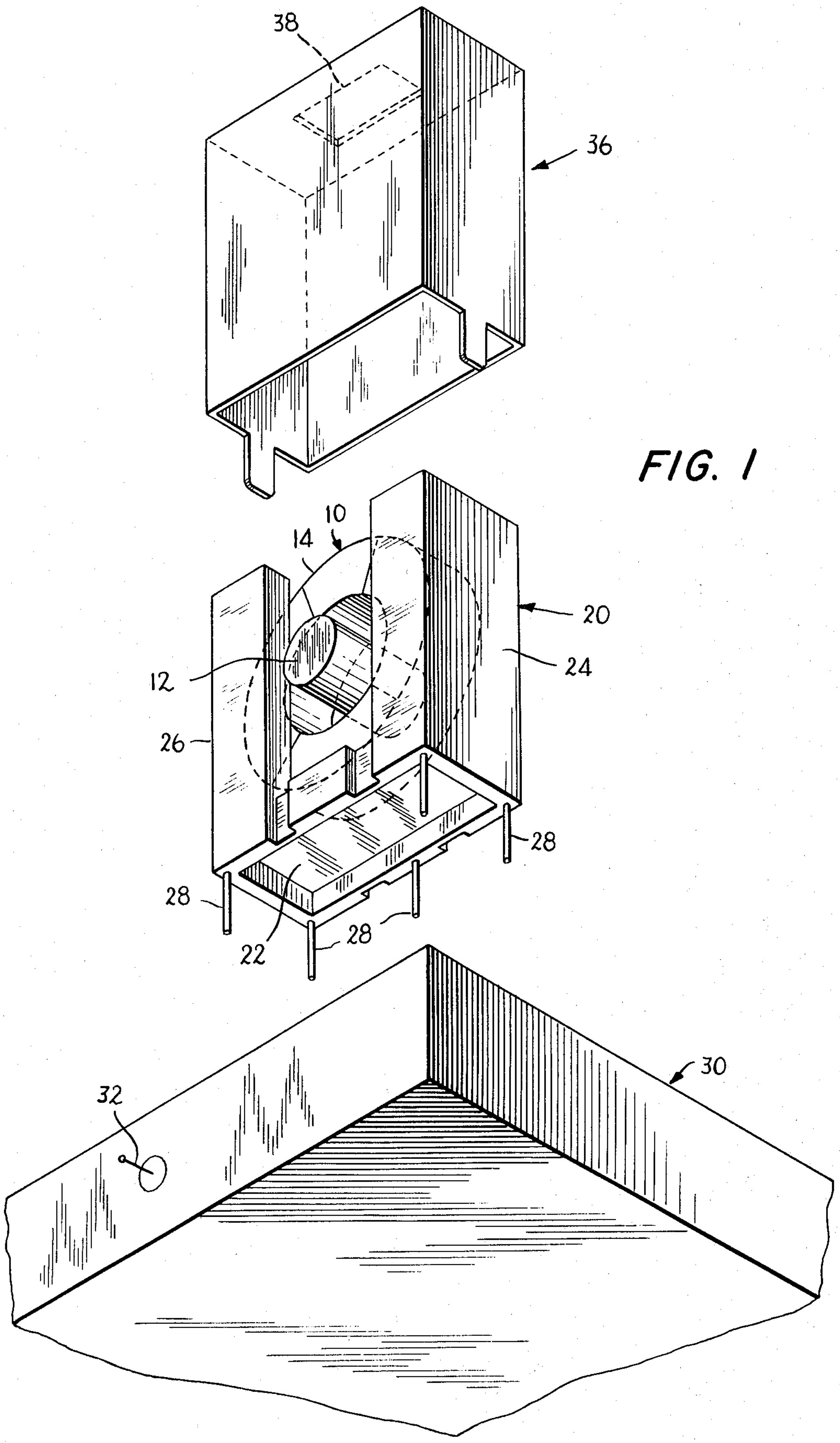
FIG. 1 is an exploded isometric view of the test fixture of the present invention with a circuit subassembly positioned therein.
Figure 2:
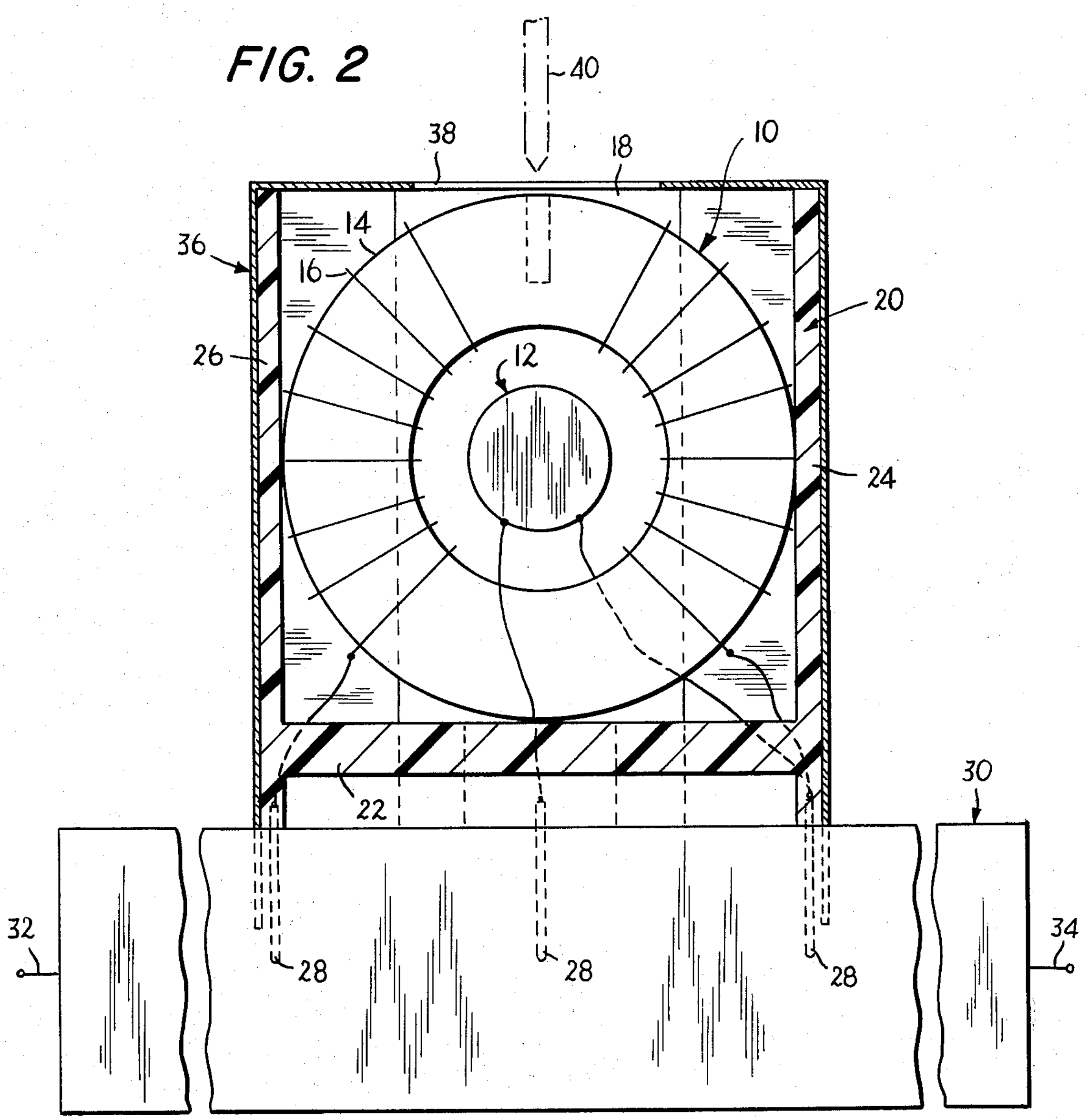
FIG. 2 is a side cutaway view of the present invention as shown in FIG. 1.

The present invention is particularly useful in tuning L-C circuits such as those shown in FIGS. 1 and 2. The L-C circuit modules shown therein comprise an inductor 10 formed from a torodial core 14 around which a conductor 16 has been wound. Conductor 16 is wound around core 14 in a single direction and the turns thereof are divided near the top of the core such that an area 18 of the core remains exposed. Thus, although the inductor 10 appears to have two separate windings, in actuality a single winding is physically divided into two sections separated by the exposed core portion 18. Subsequent to the winding of conductor 16 on core 14, the windings are cemented to the core with Q-MAX (lacquer) or some other suitable substance, to secure the turns to the core. The inductor is air dried and baked in the manner common in the industry.

The inductor is then connected to a test fixture, similar to the one described below. The fixture comprises a base adopted to accept the inductor. The input of the fixture is connected to a sweep frequency generator and the output to an oscilloscope. The inductor is then tested for frequency response and categorized into one of a number of different categories. The Q or quality of the inductor may also be determined in this test. Categorization of the inductors is necessary due to variations in the frequency response thereof caused by the materials used and the manufacturing process. In particular, variations in the frequency response are caused by variations in the core material, core dimensions, distributed capacity, winding tightness and wire dimension.

A capacitor 12 shown in the drawings as a tubular type capacitor (although other types may operate equally as well) is tested and categorized in a manner similar to that described above. To form the L-C circuit subassembly, a categorized inductor will be connected with a measured capacitor in order to provide a circuit having a resonant frequency somewhat lower in value than the desired actual final operating frequency. Capacitor 12 then may be positioned in the opening in the middle of the torodial core 14, in part in order to reduce the amount of space required by the module. The inductor-capacitor subassembly is mounted on a base 20 which consists of a recessed bottom plate 22 and a pair of side walls 24, 26. Base 20 is provided with a plurality of terminals 28 which extend from the edge of the base which surrounds recessed bottom 22 in the conventional fashion. Bottom 22 of base 20 is recessed such that components in a printed circuit board to which the module will be mounted, such as interconnecting capacitors, may be located in the cavity formed by recessed bottom 22 and the surface of the printed circuit board. In this manner the surface area of the printed circuit board can be more efficiently utilized, thus reducing the overall size of the printed circuit board and thus the filter.

The leads from conductor 16 and capacitor 12 are connected to terminals 28 by an conventional method such as soldering. Preferably, the connections are made such that capacitor 12 forms a portion of one of the turns of the inductor winding. In this manner current flowing through capacitor 12 induces a magnetic field in core 14 which is in the same direction as the magnetic field induced in core 14 by the current flowing through conductor 16. This serves to increase the inductance of the coil as well as to effect a small increase in the Q value thereof. Thus, the physical placement and electrical connection of the capacitor 12 relative to inductor 10 not only decrease the overall size of the module but also increase the electrical properties of the L-C circuit. Although the above-described physical location and electrical connection of the capacitor is an advantageous way in which to manufacture the module, it is by no means mandatory to the present invention, and the method and apparatus for calibrating the resonant circuit will function equally well with other types of L-C circuit configurations. The above-described configuration is included herein for illustrative purposes only.

In the prior art method of manufacturing modular filters of the type described, the next step would be to put in place a shielding cover, such as the one illustrated and described in application Ser. No. 460,274 referred to above. Such a shielding cover is essentially a box-like enclosure made of a conductive material such as metal. The enclosure has no bottom but the sides and top may be substantially devoid of openings. The shielding cover is manufactured to fit snugly over base 20 such that the inductor 14 and capacitor 12 are substantially completely enclosed. Means are normally provided for affixing the enclosure to base 20, such as by bendable tabs extending downward from the sides of the enclosure which, after the enclosure is placed over the base, are bent inwardly to secure the enclosure to the base. When the filter is operating, the shielding cover for each module is normally grounded thereby reducing any interaction between the modules.

After each of the modules has been placed on the printed circuit board and the appropriate interconnection therebetween made, the final assembly is tested and adjustments are made thereto. Because such adjustments must take into account the several different modules included in the filter and in the past had been performed with the shielding covers removed, a substantial amount of time is required. Further, a relatively low yield of filters performing up to the required standards is obtained from this process because in any filter if any single module is functioning incorrectly, the entire filter may be scrapped, due to the amount of time necessary to discover the problem, or at least set aside from the production procedure to be disassembled in order to find the problem. Thus, the cost of the finished product is substantially higher due to the time and labor necessary for final adjustments as well as the relatively low yield.

In the method of the present invention, each individual module is prealigned under simulated actual operating conditions such that the filter, when assembled, needs little or no adjustment and the chances of having a defective filter are substantially reduced thus increasing the finished product yield. Both of these factors contribute substantially to the reduced cost of the filter manufactured by the process of the present invention.

In order to test the modules under simulated actual operating conditions, apparatus is provided in the form of a test fixture comprising a base 30 having a plurality of terminal receptacles (not shown) similar to those present on the printed circuit board, such that the module may be mounted and demounted in the conventional manner. Base 30 is provided with an input means, shown schematically as a terminal 32 and an output means, shown schematically as a terminal 34. Terminal 32 and terminal 34 are interconnected within base 30 with the terminal receptacles in a manner similar to the manner in which the module will be interconnected in the filter. A test fixture shielding cover 36 is then placed over the module in the manner shown in FIG. 1. Test fixture shielding cover 36 is a rectangular enclosure made of conductive material with the bottom thereof left open. Test fixture shielding cover 36 is essentially similar in all respects to the shielding cover which will eventually be placed over the inductor-capacitor subassembly prior to mounting the module on the printed circuit board, except that an opening 38 is present in the top thereof. When test fixture shielding cover 36 is properly positioned over base 20, opening 38 will be aligned with the exposed portion 18 of core 14. This will permit the insertion of a tool, shown here schematically as drill 40, through opening 38 and in contact with the surface of core 14. Tool 40 can be any mechanism which is capable of removing controlled amounts of core 14 such as by drilling, grinding or scraping.

This method of mounting the module on the test fixture permits the testing and tuning thereof under conditions which simulate actual operating conditions. The actual testing is performed by connecting input terminal 32 to a signal generator, such as a sweep generator, and connecting output terminal 34 to a means of monitoring the frequency response of the module, such as an oscilloscope. The electrical properties of inductor 10 and capacitor 12 were previously measured and categorized and these components of the L-C circuit were selected such that the circuit has a lower resonant frequency than that desired of the module during operation. However, since the removal of a portion of core material 14 will cause an increase in the resonant frequency, the module can now be tuned by removal of the appropriate portion of the core material in order to achieve the desired resonant frequency.

Figure 3:
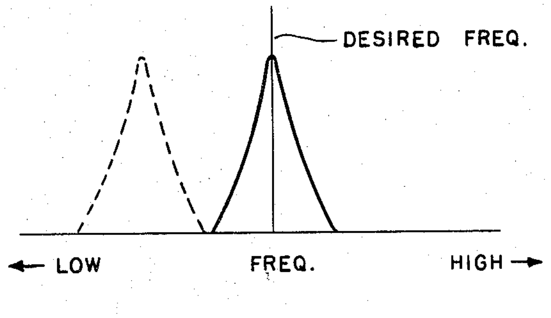
FIG. 3 is a graphical representation of the change in the resonance frequency of the resonant circuit during alignment.

FIG. 3 is a graphical representation of the resonant frequency of the module prior and subsequent to removal of the core material. The frequency response of the module prior to tuning is shown in dashed lines and it can be seen that this frequency is somewhat lower than the desired resonant frequency. Removal of the portion of the core material is achieved by inserting tool 40 through opening 38 and into contact with the exposed portion 18 of core 14. The appropriate portion of the core material is removed, as by drilling a hole into core 14. The amount of core material removed is dictated by the difference between the actual resonant frequency of the module and the desired resonant frequency. The removal of the core material can be continuously monitored by means of the oscilloscope such that extremely accurate tuning of the L-C circuit is achieved.

Once the module has been properly tuned, it is demounted from base 30 and test fixture shielding cover 36 is removed. The shielding cover which will enclose the module during operation thereof is then placed over base 20 and attached thereto. Each of the modules which will go to make up the filter are tested in this manner. Subsequent to testing each of the modules is mounted in the appropriate position on the printed circuit board. The entire filter is then placed in a test fixture, similar to the one described above, and tested for insertion loss, bandwidth and resonant frequency. Normally no further adjustment is required, and the filter is ready for operation.

The method and apparatus of the present invention reduces the overall cost of the completed filter by reducing adjustments at the final stage and increasing the production yield. In addition, these results are achieved through the use of a relatively simple and inexpensive apparatus and although the number of tests required for any particular filter may be increased, the simplicity of each test and alignment procedure is such that the aggregate time required to perform these tests is substantially less than the time required to test and tune the final product, as is commonly done in the art.

While a single preferred embodiment of the present invention has been specifically disclosed herein for purposes of illustration, it is apparent that many modifications and variations may be made thereon. It is intended to cover all of these variations and modifications which fall within the scope of this invention as defined by the appended claims.

We claim:

1. A method of calibrating a resonant frequency circuit of the type situated, under normal operating conditions, within a shielding enclosure and having an inductor with a portion of the core thereof exposed, the method comprising the steps of placing the circuit within a test enclosure simulating the shielding enclosure to be used with said circuit, energizing the circuit to simulate actual operating conditions, said test enclosure having an opening aligned with the exposed portion of the core, inserting through the opening a tool capable of removing a portion of the core material, removing the appropriate amount of core material such that the frequency of the resonant circuit is adjusted to the desired level, removing the test enclosure and placing the circuit into a shielding enclosure.

2. The method of claim 1 further comprising the steps of connecting the circuit to a frequency measuring device and monitoring the resonant frequency of the circuit as the core material is removed.

* * * * *

UNITED STATES PATENT OFFICE

CERTIFICATE OF CORRECTION

PATENT NO. : 3,908,264

DATED : September 30, 1975

INVENTOR(S) : VINCENT FRIBERG and JOHN CHESNEY

It is certified that error appears in the above-identified patent and that said Letters Patent are hereby corrected as shown below:

On the front page, the title should be corrected to read:

METHOD FOR CALIBRATING A RESONANT FREQUENCY CIRCUIT

Signed and Sealed this

*sixteenth* Day of *December 1975*

[SEAL]

*Attest:*

RUTH C. MASON
*Attesting Officer*

C. MARSHALL DANN
*Commissioner of Patents and Trademarks*